United States Patent [19]

Tiedje et al.

[11] Patent Number: 4,642,144
[45] Date of Patent: Feb. 10, 1987

[54] PROXIMITY DOPING OF AMORPHOUS SEMICONDUCTORS

[75] Inventors: Thomas J. Tiedje, Lebanon; Benjamin Abeles, Princeton, both of N.J.

[73] Assignee: Exxon Research and Engineering Company, Florham Park, N.J.

[21] Appl. No.: 539,480

[22] Filed: Oct. 6, 1983

[51] Int. Cl.[4] .................. H01L 21/203; H01L 29/06
[52] U.S. Cl. ................................. 148/175; 148/1.5; 148/174; 148/188; 29/571; 357/45; 357/30; 357/88; 357/16
[58] Field of Search ................. 29/571; 148/1.5, 174, 148/175, 187, 188, DIG. 97; 427/93, 95; 357/45 L, 30, 88, 32, 41, 90, 4, 16, 17; 136/158 AM; 156/612

[56] References Cited

U.S. PATENT DOCUMENTS

| | | | |
|---|---|---|---|
| 3,626,257 | 12/1971 | Esaki et al. | 148/DIG. 97 X |
| 4,016,586 | 4/1977 | Anderson et al. | 136/258 AM |
| 4,088,515 | 5/1978 | Blakeslee et al. | 148/DIG. 97 X |
| 4,194,935 | 3/1980 | Dingle et al. | 148/175 |
| 4,520,039 | 5/1985 | Ovshinsky | 136/258 AM |

FOREIGN PATENT DOCUMENTS 0029154  3/1980  Japan .................. 136/258 AM

Primary Examiner—Brian E. Hearn
Assistant Examiner—David A. Hey
Attorney, Agent, or Firm—Ronald D. Hantman

[57] ABSTRACT

A method of doping amorphous semiconductor films have a first bandgap by forming the first bandgap amorphous material in a first plurality of spaced apart layers; and then forming a second plurality of semiconductor layers of amorphous material having a second bandgap wider than the first bandgap interleaved with and contiguous with the first plurality such that the conductor and valence band step at the interfaces between the first plurality and the second plurality is of sufficient magnitude to confine carriers. The second plurality is doped such that the electrons in the gap states from the second plurality of layers transfer to the first plurality of layers and cause the conductivity of said first plurality to increase.

14 Claims, 10 Drawing Figures

PROXIMITY DOPING OF AMORPHOUS SEMICONDUCTORS

BACKGROUND OF THE INVENTION

This invention relates to semiconductor materials. In particular, this invention relates to a method for doping amorphous semiconductors to produce a doped material having higher conductivity with fewer defects.

Control of the conductivity type (n-type or p-type) of a semiconductor material is found to be necessary in many device applications, such as diodes solar cells and transistors. Normally the conductivity type is controlled by the addition of trace amounts of substitutional impurities with one extra or one less valence electron, for n-type and p-type material, respectively.

The problem with this doping mechanism, in both crystalline and amorphous semiconductors, is that some fraction of the dopant impurities inevitably form complexes with each other or other impurities or defects and generate states near the middle of the semiconductor's bandgap. Such states, according to the Shockley-Read-Hall theory of recombination, reduce the electron-hole pair recombination lifetime and degrade the performance of devices such as solar cells that require long recombination lifetimes; they also take up electrons (or holes) from the dopant atoms and thus degrade the substitutional doping efficiency.

Midgap states associated with impurity dopants are a particularly severe problem for amorphous semiconductors where the doping efficiency is normally low in the first place because of the ability of the amorphous network to accommodate impurity atoms in their preferred coordination. In a-Si:H for example, the doping efficiency is of order 1% with phosphorous or boron. An additional problem with substitutional doping, of particular importance for crystalline semiconductors, is ionized impurity scattering from the dopant atoms themselves. This ionized impurity scattering associated with substitutional dopants reduces the electron and hole mobility, particularly at low temperatures. This effect degrades the switching speed of transistors made from doped material and reduces the diffusion length in solar cells.

In substitutionally doped amorphous silicon the large density of gap states associated with the dopants means that the depletion or accumulation layers associated with Schottky contacts or externally applied gate voltages are thin in doped material, being of order 500A thick, which is not as thick as would be desirable in field effect transistors.

These deficiencies, and others, are avoided by the method of the present invention wherein the conductivity type of amorphous semiconductors is controlled by fabricating the semiconductor in the form of a plurality of relatively narrow bandgap layers and proximity doping these layers from a second plurality of wider bandgap semiconductor layers which are interleaved with the first plurality. The multilayered structures are commonly known as superlattices.

SUMMARY OF THE INVENTION

The present invention is a method of doping amorphous semiconductor films having a given bandgap. This given bandgap amorphous material is formed into a first plurality of spaced apart layers. Then a second plurality of semiconductor layers of amorphous material having a bandgap wider than the first given bandgap is interleaved with and contiguous with said first plurality such that the conduction and valence band step at the interfaces between the first plurality and said second plurality is of sufficient magnitude to confine carriers. The second plurality is doped such that the charge carriers in the gap states from the second plurality of layers transfer to the first plurality of layers and cause the conductivity of said first plurality to increase.

DESCRIPTION OF THE PREFERRED EMBODIMENT

The present invention is a semiconductor device and method to fabricate it. The material is a superlattice in which the layers fabricated from the relatively low bandgap material have been proximity doped by the wider bandgap layers. Before discussing the proximity doping, the superlattice material and its preparation are discussed.

SUPERLATTICE MATERIAL

Figure 5:
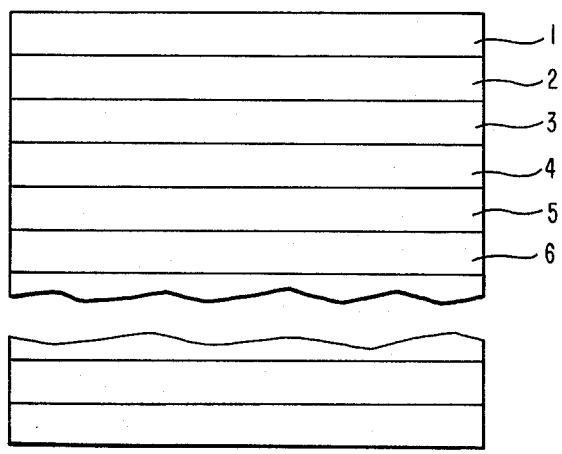
FIG. 5 shows a multilayered structure of alternating wide bandgap and narrow bandgap amorphous semiconductor layers.

An amorphous superlattice is a multilayered material whose layers are thin sheets of semiconducting or insulating tetrahedrally bonded amorphous material where the material is formed from tetrahedrally bonded elements or alloys containing said tetrahedrally bonded elements. Each layer is less than 1500A thick. In a preferred embodiment, the entire layered structure is a thin film material, that is a material that is less than about 10 microns thick. Referring to FIG. 5 the first and alternate layers 1, 3, 5 of the structure have the same given composition while the second and alternate layers 2, 4, 6 . . . have the same composition different from the given composition of layers 1, 3, 5 . . . . Therefore, the spatial repeat distance of the material is the thickness of layer 1 plus layer 2. That is, layer 3 plus layer 4 is a repeat of layer 1 plus layer 2, etc.

The optical bandgap (as discussed below) of the composition may differ from that of materials comprising the individual layers. In a preferred embodiment, the repeat distance is of order 1000A.

Figure 1:
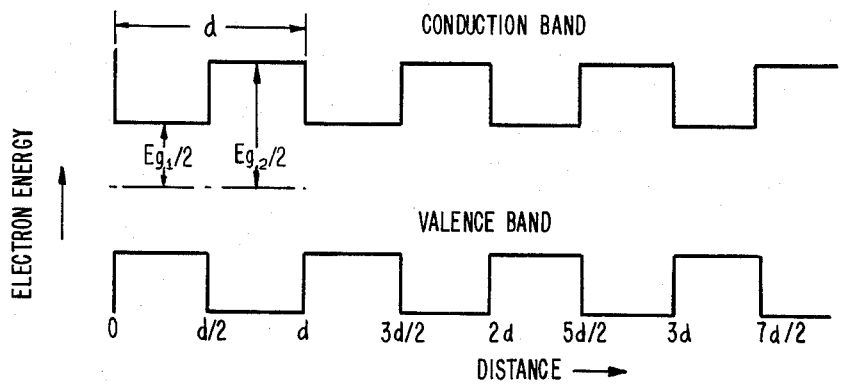
FIG. 1 shows a schematic energy band diagram for electrons and holes in semiconductor superlattice material, in which the compositional modulation is due to alloying or other gross compositional variation.
Figure 2:
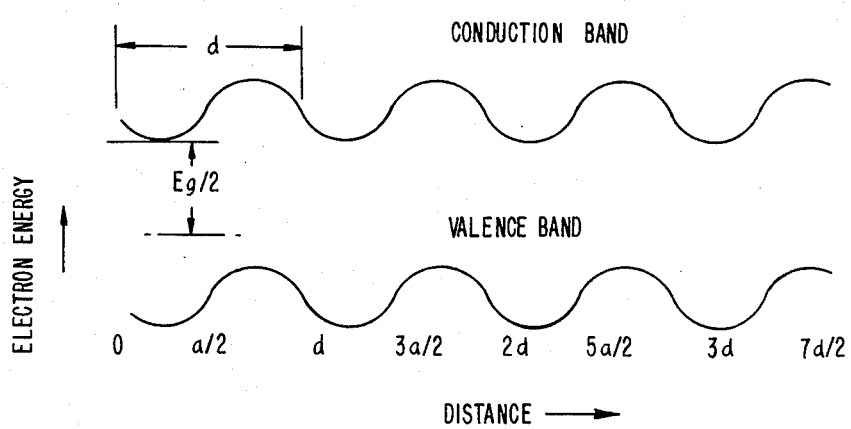
FIG. 2 shows an energy band diagram for a semiconductor superlattice material in which the compositional modulation is associated with doping. Here the doped layers are thicker than a depletion length.

A description of the electronic energy levels in terms of well defined E vs k relations, where E is the electronic energy and k is its wavevector, is not possible in amorphous semiconductors in the same way as it is in crystalline semiconductors. Nevertheless, some general features of the electronic energy level spectrum are known to be the same in both crystalline and low defect density amorphous semiconductors. For example, both type of semiconductors have a gap in the density of states between a broad distribution of filled levels (the valence band) and a broad distribution of empty levels (the conduction band). In crystals these energy bands have relatively sharp edges, broadened only by the thermal motion of the crystal lattice. In amorphous semiconductors the density of states edges are broader, being broadened by the structural disorder of the amorphous network in addition to the thermal motion of the atoms. The width of the low energy absorption tail of the optical absorption edge is one measure of the sharpness of the band edges in amorphous or crystalline semiconductors. In any case, an objective measure of the position of the band edges can be defined for both crystalline or amorphous semiconductors by, for example, the energy at which the density of states of the bulk material drops to $10^{20} cm^{-3} ev.^{-1}$. In this sense, energy band diagrams such as those shown in FIGS. 1 and 2, as described above can equally well be applied to amorphous and crystalline semiconductors. The modulation in the band edge energies illustrated in FIGS. 1 and 2 is obtained by modulation of the thin film composition.

Figure 3:
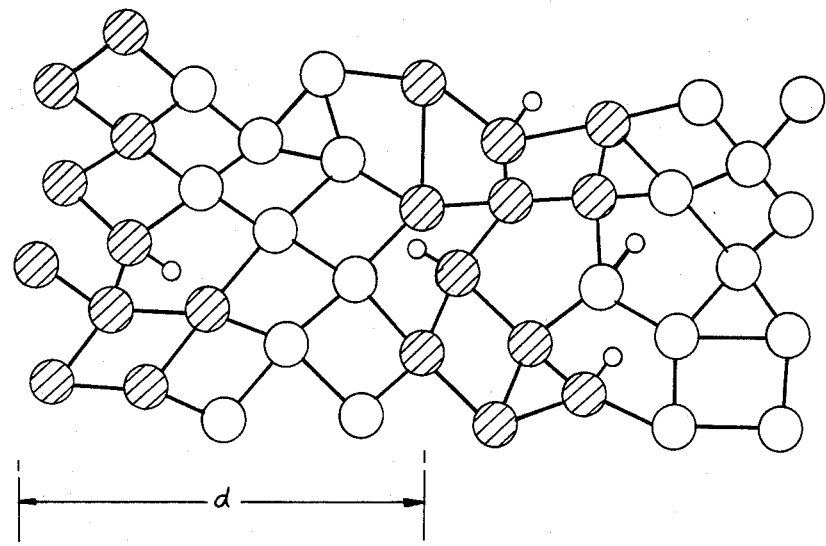
FIG. 3 is a schematic diagram of the position of the individual atoms in the superlattice structure of the present invention.
Figure 4:
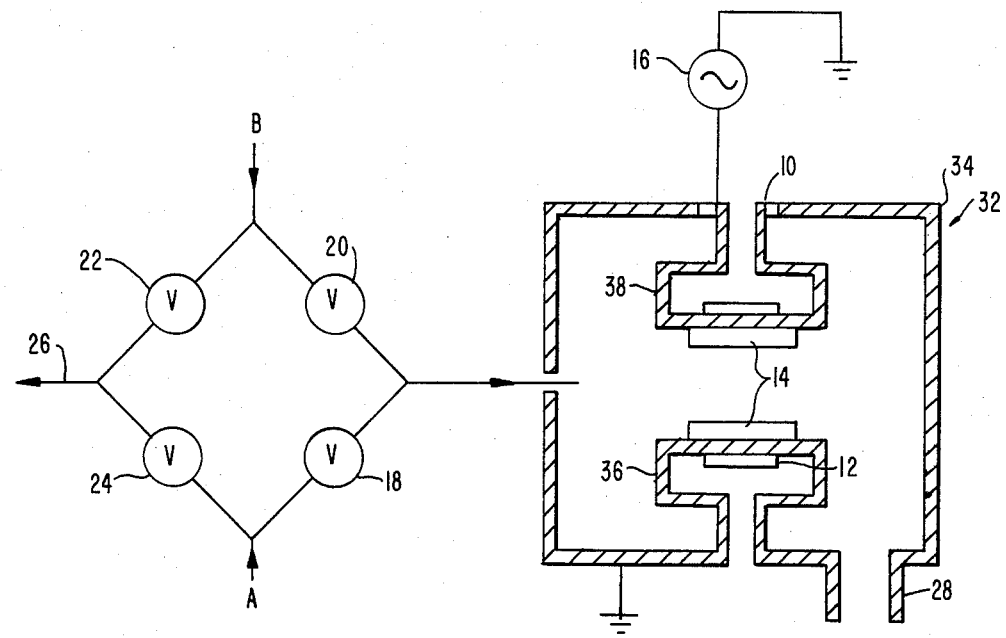
FIG. 4 is a schematic diagram of a plasma assisted chemical vapor deposition reactor.

The interfacial regions between the layers of the composition of matter of the present invention are substantially defect free. Referring to FIG. 3 shows a schematic diagram of the lattice structure of the present invention in which the atoms of the alternating layers are indicated by light and dark circles and hydrogen atoms by smaller light circles. The period of structures is d. As indicated in FIG. 4, there are substantially no dangling bonds to give rise to defects at the interfaces. As is well-known in the art hydrogen incorporated into the structure has a beneficial effect towards reducing the density of dangling bonds.

Examples of amorphous semiconducting and insulating materials that can be fabricated into amorphous semiconductor superlattices according to this invention, can be divided into two classes:

(1) Group IVA Elements and Alloys include:
 a-Si:H, a-Ge:H, a-Si$_{1-x}$C$_x$:H, a-Si$_{1-x}$Ge$_x$:H, a-Si$_{1-x}$N$_x$:H, a-Si$_{1-x}$Sn$_x$:H, a-Si$_{1-x}$ Sn$_x$:H, a-Si$_{1-x}$O$_x$:H, a-C:H (tetrahedrally coordinated) a-Si$_{1-x-y}$O$_x$N$_y$:H plus alloys and halogenated (F, Cl) versions of the hydrogenated materials listed (e.g. a-Si$_{1-x-y}$Ge$_x$Sn$_y$:H:F).

(2) Group IVA Elements and Alloys Doped with Group IIIA and VA Elements

Suitable n type dopants include N, P, As, Sb, and suitable p type dopants include B, Al, Ga, In, Tl.

As used herein, the subscripts are the atomic fractions of the elements in the material. For example, if $x=\frac{2}{3}$, then a-Si$_{1-x}$O$_x$:H is a-Si$_{1/3}$O$_{2/3}$:H which is a-SiO$_2$:H.

Layers 1, 3, 5 . . . and layers 2, 4, 6 . . . may comprise any two of the materials where both are selected from the same class, e.g. a-Si:H/a-Si$_{1-x}$N$_x$:H or n-doped a-SiH/p-doped a-Si:H.

In addition the alternating layers may include one material from class 1 alternating with a material from class 2, e.g. a-Si:H/n-doped a-Si$_{1-x}$N$_x$:H.

The composition of the present invention also includes layered materials of the form n-i-p-i-n-i-p-i, where n and p are n-doped and p-doped material derived from an undoped amorphous semiconductor material, i, by the addition of small concentrations of n and p-type dopant, respectively. In this case, each layer 1, 3, 5 . . . is considered to be n-i and each layer 2, 4, 6 . . . is considered to p-i so that the spatial repeat distance is the thickness of n-i-p-i.

The composition of the present invention also includes layered materials of the form n-i-n-i-n-i-n-i, where n is n-doped material derived from an undoped amorphous semiconductor material, i, by the addition of small concentrations of n dopant. In this case, each layer 1, 3, 5 . . . is considered to be n and each layer 2, 4, 6 . . . is considered to i so that the spatial repeat distance is the thickness of n-i.

The composition of the present invention also includes layered materials of the form p-i-p-i-p-i-p-i, where p is p-doped material derived from an undoped amorphous semiconductor material, i, by the addition of small concentrations of p-type dopant. In this case, each layer 1, 3, 5 . . . is considered to be p and each layer 2, 4, 6 . . . is considered to i so that the spatial repeat distance is the thickness of p-i.

The composition of matter of the present invention also includes layered materials where the composition of each layer is modulated across the layers. For example, if the alternating layers are a-Si:H and a-Ge:H alloys, the transition from a-Si:H to a-Ge:H and from a-Ge:H to a-Si:H may occur gradually over the layer thicknesses starting with a-Si:H, gradually increasing the percentage of a-Ge:H until it is all a-Ge:H. In the next adjacent layer, the percentage of a-Si:H is increased until it is all a-Si:H. All succeeding layers repeat this sequence.

The materials in the two groups can be prepared by plasma assisted decomposition of gaseous mixtures of volatile hydrides, fluorides or chlorides or of the elemental gases themselves in the case of $O_2$, $N_2$, $Cl_2$ and $F_2$, as described below.

Preparation of Superlattice Material

There are several deposition processes that are known to produce low defect density amorphous semiconductors. These include PCVD, low temperature CVD and sputtering. Low temperature CVD is restricted to reactive gases that decompose at relatively low temperature such as for example $Si_2H_6$. Sputtering has the advantage of being capable of producing a wider variety of amorphous semiconductor materials than can be made by PCVD or CVD, however, sputtered films usually contain more defects than PCVD films. We describe here a method for using PCVD to make amorphous semiconductor superlattices. To make amorphous semiconductor superlattices by sputtering it is possible to modify the technique (A. H. Eltoukhy and I. E. Greene J. Appl. Phys. 50, 505 (1979)) for making crystalline semiconductor superlattices by changing the deposition conditions (e.g. substrate temperature, gas pressure and addition of $H_2$ to the plasma discharge) to produce hydrogenated amorphous rather than crystalline semiconductors.

Referring to FIG. 4 a PCVD apparatus for carrying out the fabrication of the superlattice material of the present invention is designated as 32. The PCVD apparatus includes a vacuum chamber typically of stainless steel. In the vacuum chamber 3 are electrodes 36 and 38. Electrode 36 is grounded and referred to as the anode. Electrode 38 is insulated from the stainless steel chamber by insulator 10 and is referred to as the cathode. Flat heaters 12 are contained in the electrodes. Substrates 14 which can be insulators such as quartz or metals such as stainless steel are placed in good thermal contact with the electrodes.

The plasma is produced by a low power (5–10 W) RF (13.5 Mhz) discharge, by means of an RF generator 16 connected to the cathode. To deposit layered films the composition of the gas in the reactor 32 is changed periodically by opening and closing alternately neumatic valves 18 and 20 to admit gas A or gas B into the reactor.

In order to avoid setting up pressure transients through the opening and closing of valves 18 and 20 the gases A and B are alternatively shunted into a ballast pump 26 by opening and closing valves 22 and 24 in phase with valves 18 and 20, respectively. The gases are pumped continuously out of the reactor by a pump through outlet 28.

To achieve abrupt changes in composition between adjacent layers requires that the time it takes to change gases in the reactor (molecular residence time) be short compared to the time it takes to grow a monolayer. The molecular residence time R is given by $$R = V_p/F_o P_o$$

where V is the volume of the reactor, p is the gas pressure in the reactor and F is the gas flow rate at standard pressure $P_o$. R can be varied over a wide range of values. In our experiments we have used V=30 liters, p=30 m torr, Fo=0.1 liter/min which gives R=1 sec. With a typical deposition rate of 1Å/sec. the transition from one layer to the next takes place over a distance of less than a single atomic layer. The sub layer thickness is given by the product of the deposition rate and the flow period of the gas. The thickness of the sublayers can be varied from a submonolayer to thousands of angstroms.

Example of amorphous semiconductor superlattices that have been produced include:

a-Si:H/a-Ge:H a-Si:H/a-Si$_{1-x}$N$_x$:H a-Si:H/a-Si$_{1-x}$C$_x$:H

The a-Si:H sublayers were made from pure SiH$_4$. The a-Ge:H sublayers were made from a mixture of 10% GeH$_4$+90% H$_2$. The a-Si$_{1-x}$C$_x$:H sublayers were made from a mixture of 50% SiH$_4$+50% CH$_4$. The a-Si$_{1-x}$N$_x$:H layers were made from a mixture of 20% SiH$_4$+80% NH$_3$. The substrate temperatures were in the range 180°–250° C.

Amorphous semiconductor n-i-p-i, p-i-p-i, p-n-p-n, n-i-n-i superlattice structures can be formed by any of the methods described above by changing periodically the dopant concentration in the gas. For example by flowing into the reactor first SiH$_4$+1% PH$_3$, then SiH$_4$ and then SiH$_4$+1% B$_2$H$_6$ and repeating this sequence periodically we obtain an amorphous semiconductor n-i-p-i superlattice.

Proximity Doping

Referring to FIG. 5, a multilayered semiconductor structure is shown which has been constructed according to the method of the present invention. It comprises a first plurality of relatively narrow bandgap semiconductor layers 2 and a second plurality of wider bandgap semiconductor layers 4 interleaved with and contiguous with the first plurality. If the wide bandgap layers are n-type, then the materials of the layers should be chosen such that a step $E_c$ is produced in the conduction band of at least several times kT. Conversely, when the wide bandgap material is p-type a similar step $E_v$ would be required in the valence band.

It should be noted that the structure in FIG. 5 need not be periodic; that is, while each pair of adjacent layers should satisfy the above-conditions, each pair need not be identical in thickness, doping level or bandgap to any other pair of layers in the structure.

Figure 6:
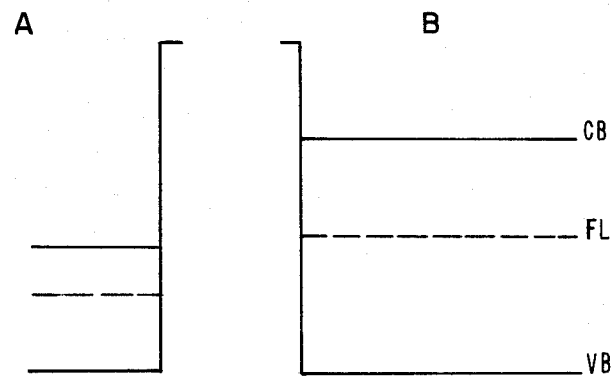
FIG. 6 shows a schematic diagram of the energy levels of a wide bandgap semiconductor and a narrow bandgap semiconductor before being brought together.

Referring to FIG. 6 shows the energy levels of a wide bandgap amorphous semiconductor B and a narrow bandgap amorphous semiconductor A before contact. The conduction band, valence band and Fermi level are indicated as CB, VB, and FL, respectively.

Although only n-type doping is discussed in the following, the generalization to p-type doping is obvious.

In the method of the present invention, electrons (or holes) are added to narrow bandgap semiconductor material by the incorporation of doped larger bandgap sublayers 10–50A thick that are less electronegative than the narrow bandgap semiconductor material. In semiconductor terminology, for n-type doping the Fermi level in the larger bandgap material should be higher than in the semiconductor to be doped. Although in the preferred embodiment the wide bandgap material is doped substitutionally n-type (or p-type) substitutional doping is not always necessary as long as the gap states that are always present at some density in amorphous semiconductors, have the required relationship between each other in the two sublayers as specified below.

Figure 7:
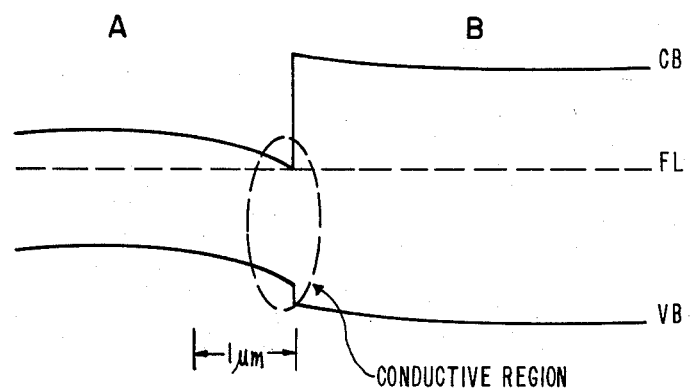
FIG. 7 shows a schematic diagram of the evergy levels of a wide band gap semiconductor and a narrow and gap semiconductor after being brought together.

When the narrow bandgap and wide bandgap materials are brought together, electrons will transfer from the high Fermi level material to the low Fermi level material. Thus the semiconductor material close to the wider bandgap material (within one depletion length, which is of order 1 μm in a-Si:H$_x$) will be doped by virtue of its proximity to the less electronegative material. FIG. 7 shows the resulting energy level (band) diagram for the combined materials.

Since the thin sublayers that are added as electron donors have a larger bandgap, their Fermi level can be above the conduction band edge of the semiconductor to be doped. Thus if the density of charge in the wide gap material is large enough, the Fermi level in the proximity doped material can be shifted almost all the way to the conduction band edge.

The condition for the large bandgap material to dope the small bandgap material n-type is as follows. (This condition can be trivially generalized to the opposite case, namely p-type doping). This condition is most easily described with reference to the neutral level in the material. We define the neutral level as the energy level position in the bandgap at which the Fermi level would have to be positioned to make the material locally neutral with no excess of positive over negative charges. In a neutral piece of semiconductor material, more than one depletion length away from any surfaces or interfaces, the Fermi level will be located at the neutral level. When two semiconductor or insulator materials are brought together to form a hetero-contact the conduction and valence band edges will line up in some manner, such as illustrated in FIG. 7, for example, as determined by the work function of the two materials and any interfacial dipole layer. The Fermi level assumes a common value for the two materials when they are joined at the heterojunction. Now let us consider a multilayered material comprising layers of semiconductor (or insulator) A alternating with semiconductor (or insulator) B. Let us further assume that at the junction between A and B the bottom of the conduction band of semiconductor B is at a higher energy than the bottom of the conduction band of semiconductor A, and that the difference in energy between the two band edges is in excess of about 0.05 ev. Let us assume that the conductivity in the plane of the layers in the multilayered material is n-type. (There is no loss of generality here because the arguments can be extended to p-type doping in an obvious way).

The condition for material B, normally the large bandgap material, to dope material A n-type, normally the smaller bandgap material can now be expressed as follows: The product of the thickness of Layer B and the density of states in material B between the neutral level in B and the neutral level in A must be larger than the corresponding product for layer A, that is, the product of the density of gap states in A between the neutral level in A and the neutral level in B and the thickness of layer A. In the foregoing sentence it is understood that if layers A or B are thicker than a depletion width, then the physical thickness of the layer in the product should be replaced by the thickness of the depletion layer. Furthermore, if there are interface states in the energy levels lying between the two neutral levels, then the density-of-states-thickness product for B must exceed the sum of the density of interface states (cm$^{-2}$) plus the density-of-states-thickness product for A, in order for significant proximity doping of A to take place. In the limit that the density-of-states-thickness product for B is large compared to both the interface state density and the density-of-states-thickness product for A, then the Fermi level in sublayer A will shift substantially all the way to the neutral level in sublayer B. If this level is higher than the neutral level in A then A will be doped n-type and its conductivity will increase. If the neutral levels have the opposite relationship then the material A will become less conductive. If the above-mentioned density of states relation is not met, for example if the density-of-states-thickness product for A and B are about the same, then the Fermi level will assume an intermediate position between the two neutral levels. In this discussion the layer B is the electron donor layer. For purposes herein, the term density of gap states thickness products shall be defined as described above.

Although the active states in the donor layer are mid-gap states, they do not degrade electronic properties in the doped material such as recombination lifetime because free electrons in the doped material are kept away from these states by the potential barriers associated with the fact that the donor layer has a larger bandgap. Thus not only does the proximity doped material have an improved conductivity it will also have an improved photoconductivity in general.

EXAMPLE 1

Figure 8:
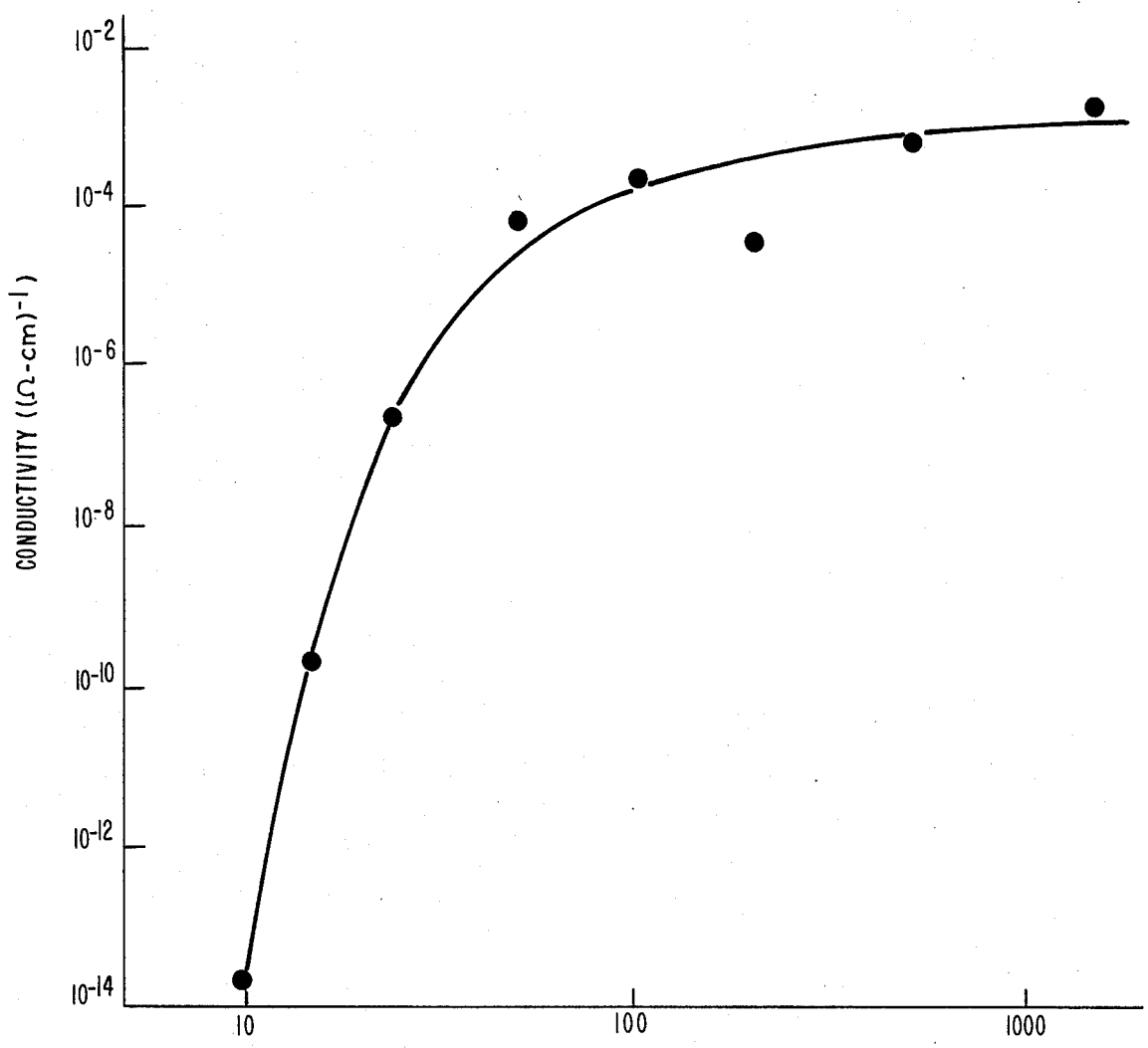
FIG. 8 shows the optical absorption coefficient as a function of photon energy for substitutionally doped, proximity doped and undoped material.

The proximity doping method described above has been reduced to practice with the n-type doping of 1500A thick a-Si:H layers alternating with 35A thick a-Si$_{1-x}$N$_x$:H electron donor layers fabricated as described above. The a-SiN$_x$:H layer was not in itself substitutionally doped. In FIG. 8 we show the conductivity of a series of a-Si:H/a-Si$_{1-x}$N$_x$ superlattice materials with fixed a-Si$_{1-x}$N$_x$:H sublayer thickness (27A) and variable a-Si:H sublayer thickness. The data is plotted as a function of the a-Si:H sublayer thickness $d_{si}$. Note that for relatively large a-Si:H sublayer thicknesses ($d_{si} > 100$A), where the quantum confinement of the electronic states no longer has a significant effect on the position of the electronic energy levels the conductivity of the superlattice material (measured in the plane of the film) exceeds the conductivity of homogeneous a-Si:H prepared in the same way ($\sim 10^{-8}(\Omega cm)^{-1}$) by some five orders of magnitude. This conductivity increase is due to the proximity doping effect. In-plane dark conductivities of order $10^{-3}$ ($\Omega cm)^{-1}$ have been achieved, with a film consisting of ten periods of the above structure. The conductivity of this material is as high or higher and the activation energy as low or lower than the most heavily substitutionally doped material prepared under similar conditions.

Two additional experimental results confirm that the proximity doped material does indeed have improved electronic properties over the substitutionally doped material. First, the material is photoconductive, with a conductivity under one sun illumination in excess of $10^{-2}$ ($\Omega cm)^{-1}$, or as good or better than the most photoconductive undoped material. For comparison, comparable conductivity material substitutionally doped with phosphorous has a photoconductivity less than the dark conductivity.

Figure 9:
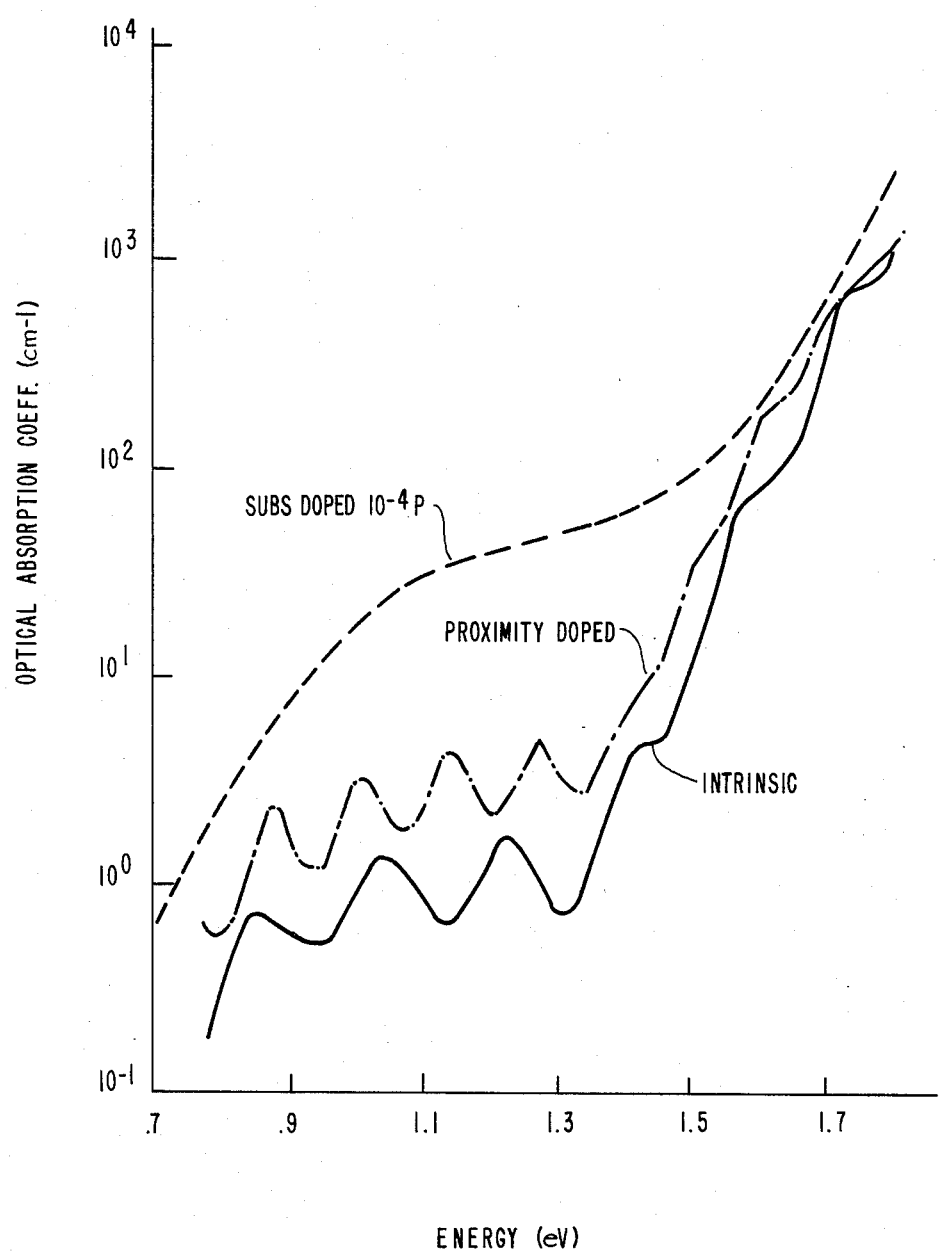
FIG. 9 shows the conductivity as a function of thickness of the narrow bandgap material.

Secondly, the midgap defect density of the 1500A/35A structure has been characterized by the photoconductivity spectral response technique as shown in FIG. 9. Also shown in FIG. 8 is the photoconductivity spectral response for bulk homogeneous a-Si:H and phosphorous doped a-S:H with conductivity equal to the proximity doped material.

In FIG. 9 the weakly energy dependent absorption at low photon energies (1.0–1.4 ev) is proportional to the density of midgap states. Note that the defects in the undoped a-Si:H are between one and two orders of magnitude lower than in the comparable substitutionally doped material. Thus we have achieved doping with reduced defect density.

EXAMPLE 2

The doping mechanism described above makes "normally on", depletion mode a-Si:H field effect transistors possible. Only accumulation mode transistors are practical with presently available intrinsic material (too resistive) and doped material (too narrow a depletion width).

Figure 10:
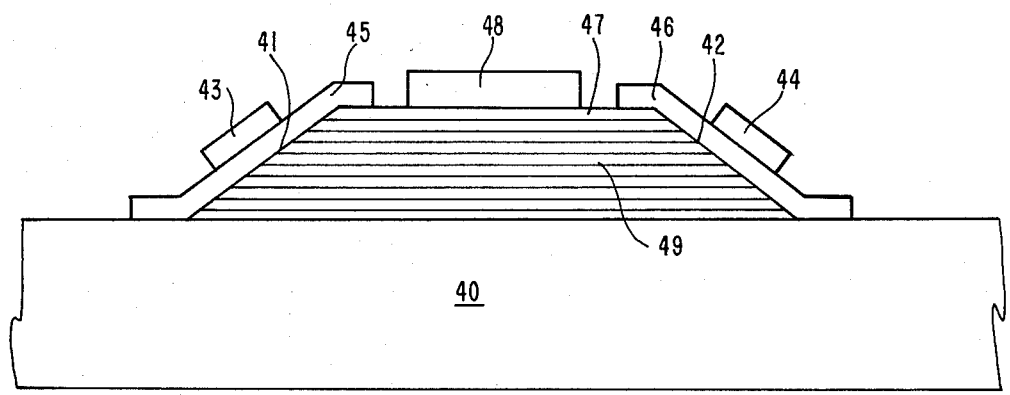

A schematic diagram of a field effect transistor that utiles the proximity doped material is shown in FIG. 10. Other elements of the thin film transistor are as follows: n+ doped a-Si, 45, 46; substitutionally doped source/drain contacts with associated metal electrodes 43, 44; thick a-Si$_{1-x}$N$_x$:H (2000A) gate insulator 47; gate electrode metal, 48; and a chanel formed from a-Si:H/Si$_{1-x}$N$_x$:H proximity doped superlattice material, 49, as in example 1 above. The tapered edges 41 and 42 in FIG. 10 at the source and drain contacts 43 and 44 can be made by ion beam milling or they can be formed during the film deposition process from the tapered penumbra underneath a shadow mask that is not in close contact with the substrate 40 during the film deposition.

What is claimed is:

1. A method of doping amorphous semiconductor material having a first bandgap comprising:
    (a) forming said first bandgap amorphous material in a first plurality of spaced apart layers; and
    (b) forming a second plurality of amorphous semiconductor or insulator layers having a second bandgap wider than said first bandgap interleaved with and contiguous with said first plurality such that the conduction and valence band steps at the interfaces between said first plurality and said second plurality is of sufficent magnitude to confine carriers, such that the Fermi levels in the two layers are different so that carriers in the gap states transfer from said second plurality of layers to said first plurality causing the conductivity of said material to increase.

2. The method of claim 1 wherein said forming steps are carried out by growing said layers by plasma-assisted chemical vapor deposition.

3. The method of claim 1 wherein said first plurality of layers is selected from the group consisting of a-Ge:H, a-Si:H, a-Si$_{1-x}$Ge$_x$:H and a-Si$_{1-x}$C$_x$:H and said second plurality of layers is selected from the group consisting of a-Si:H, a-Si$_{1-x}$C$_x$:H, a-Si$_{1-x}$N$_x$:H and a-Si$_{1-x}$O$_x$:H such that the material selected for said first plurality of layers is different from the material selected for said second plurality of layers.

4. The method of claim 3 wherein said first plurality of layers is a-Si:H and said second plurality of layers is a-Si$_{1-x}$N$_x$:H.

5. The method of claim 4 wherein said first layers have a thickness between 10 and 2000Å and said second layers have a thickness between 40 and 1000Å.

6. The method of claim 3 wherein said first plurality of layers is a-Si:H and said second plurality of layers is a-Si$_{1-x}$C$_x$:H 7. The method of claim 3 wherein said first plurality of layers is a-Si:H and said second plurality of layers is a-Si$_{1-x}$O$_x$:H.

8. The method of claim 3 wherein said first plurality of layers is a-Ge:H and said second plurality is a-Si:H.

9. The method of claim 3 wherein said first plurality of layers is a-Ge:H and said second plurality is a-Si$_{1-x}$C$_x$:H.

10. The method of claim 3 wherein said first plurality of layers is a-Ge:H and said second plurality if a-Si$_{1-x}$N$_x$:H.

11. The method of claim 3 wherein said first plurality of layers is a-Ge:H and said second plurality if a-Si$_{1-x}$O$_x$:H.

12. The method of claim 1 wherein said second plurality of layers is doped n-type.

13. The method of claim 1 wherein said second plurality of layers is doped p-type.

14. A method of doping amorphous semiconductor films having a first bandgap comprising:
    (a) forming said first bandgap amorphous semiconductor material in a first plurality of spaced apart layers; and
    (b) forming a second plurality of amorphous semiconductor or insulator layers having a second bandgap wiser than said first bandgap interleaved with and contiguous with said first plurality such that the conduction and valence band steps at the interfaces between said first plurality and said second plurality is of sufficient magnitude to confine carriers, such that the Fermi levels in the two layers are different so that carriers in the gap states transfer from said second plurality of layers to said first plurality causing the conductivity of said film to increase, said second plurality having a density of gap states thickness product that exceeds that of said first plurality.

* * * * *